(12) United States Patent (10) Patent No.: US 8,212,335 B2
Fujioka (45) Date of Patent: Jul. 3, 2012

(54) SEMICONDUCTOR SUBSTRATE HAVING A FLEXIBLE, HEAT RESISTANT, GRAPHITE SUBSTRATE

(75) Inventor: Hiroshi Fujioka, Tokyo (JP)

(73) Assignee: The University of Tokyo, Tokyo (JP)

( * ) Notice: Subject to any disclaimer, the term of this patent is extended or adjusted under 35 U.S.C. 154(b) by 143 days.

(21) Appl. No.: 12/735,826

(22) PCT Filed: Feb. 20, 2009

(86) PCT No.: PCT/JP2009/053078
§ 371 (c)(1),
(2), (4) Date: Aug. 18, 2010

(87) PCT Pub. No.: WO2009/104759
PCT Pub. Date: Aug. 27, 2009

(65) Prior Publication Data
US 2010/0320450 A1    Dec. 23, 2010

(30) Foreign Application Priority Data
Feb. 21, 2008  (JP) ................... 2008-039672

(51) Int. Cl.
*H01L 29/12* (2006.01)
*H01L 31/0256* (2006.01)
*H01L 29/06* (2006.01)
*H01L 31/0328* (2006.01)
*H01L 31/0336* (2006.01)
*H01L 31/072* (2006.01)
*H01L 31/109* (2006.01)
*H01L 27/15* (2006.01)
*H01L 29/26* (2006.01)
*H01L 31/12* (2006.01)
*H01L 33/00* (2010.01)
*H01L 29/24* (2006.01)
*H01L 23/58* (2006.01)

(52) U.S. Cl. ............ 257/613; 257/13; 257/79; 257/103; 257/798; 257/E33.001

(58) Field of Classification Search ............... 257/13, 257/79, 103, 613, 798, E33.001
See application file for complete search history.

(56) References Cited

U.S. PATENT DOCUMENTS
3,961,997 A * 6/1976 Chu ................... 438/97
(Continued)

FOREIGN PATENT DOCUMENTS
JP    62-046604 A    2/1987
JP    04-147613 A    5/1992
JP    08-250264 A    9/1996
(Continued)

*Primary Examiner* — Ida M Soward
(74) *Attorney, Agent, or Firm* — Kenyon & Kenyon LLP

(57) ABSTRACT

To provide a semiconductor substrate, a semiconductor device, a light emitting device and an electronic device which have a low price, a long lifetime, and a high luminescent efficiency, and moreover are capable of being bent. A graphite substrate having heat resistance and having flexibility with respect to external force, and a first semiconductor layer, provided on the graphite substrate, which is made of a nitride of the Group XIII are included, and a method such as pulse sputter deposition can be used in forming the first semiconductor layer on the graphite substrate, to thereby allow inexpensive manufacture to be possible. In addition, since the nitride of the Group XIII is an inorganic substance, it has a long lifetime, and thus a high luminescent efficiency can be obtained. Moreover, since the graphite substrate has flexibility with respect to external force, it can also be bent.

8 Claims, 9 Drawing Sheets

U.S. PATENT DOCUMENTS

| | | | |
|---|---|---|---|
| 5,079,481 A * | 1/1992 | Moslehi | 315/111.41 |
| 5,308,594 A * | 5/1994 | Chen | 117/222 |
| 5,650,592 A * | 7/1997 | Cheskis et al. | 174/540 |
| 5,780,820 A | 7/1998 | Komyoji et al. | |
| 5,895,938 A | 4/1999 | Watanabe et al. | |
| 6,758,263 B2 * | 7/2004 | Krassowski et al. | 165/185 |
| 7,067,926 B2 * | 6/2006 | Yamazaki et al. | 257/777 |
| 7,187,114 B2 * | 3/2007 | Takeuchi et al. | 313/495 |
| 7,420,810 B2 * | 9/2008 | Reis et al. | 361/707 |

FOREIGN PATENT DOCUMENTS

| | | |
|---|---|---|
| JP | 09-007587 A | 1/1997 |
| JP | 09-283797 A | 10/1997 |
| JP | 10-321954 A | 12/1998 |
| JP | 2000-022205 A | 1/2000 |
| JP | 2003-059845 A | 2/2003 |
| JP | 2007-323814 A | 12/2007 |
| JP | 2008-021480 A | 12/2007 |
| JP | 2008-021480 | 1/2008 |

\* cited by examiner

| WAVELENGTH (nm) | 350 | 400 | 450 | 470 (BLUE) | 500 | 550 | 600 | 650 |
|---|---|---|---|---|---|---|---|---|
| ZrN REFLECTIVITY | 7.8% | 29.1% | 60.0% | 65.6% | 71.9% | 78.4% | 82.8% | 85.6% |

SEMICONDUCTOR SUBSTRATE HAVING A FLEXIBLE, HEAT RESISTANT, GRAPHITE SUBSTRATE

TECHNICAL FIELD

The present invention relates to a semiconductor substrate, a semiconductor device, a light emitting device and an electronic device.

This application claims the benefit of Japanese Application No. 2008-039672, filed in the Japanese Patent Office on Feb. 21, 2008, the content of which is incorporated herein by reference.

BACKGROUND ART

Nitride-based LEDs using p-n junction of AlN, GaN, InN which are nitrides of the Group XIII and the mixed crystal phase thereof have been widely put to practical use. Since the nitride-based LEDs are inorganic substances, and have high binding energy of materials, it is known that they have a long lifetime, and have a high internal luminescent efficiency (internal quantum efficiency) of 90%. These nitride-based LEDs are often mass-produced on a high-priced monocrystalline substrate, such as sapphire or silicon carbide, using a metallo organic chemical vapor deposition method (MOCVD method) having low mass productivity. For this reason, they are expensive for use as a surface light source, and thus have been used only as a point light source.

On the other hand, organic EL devices are known as a surface light sources (see, for example, Patent Document 1). Since the organic EL devices can use a low-priced plastic substrate or glass substrate as a starting material, the prices of the devices can be lowered, and use as a surface light source is possible. In addition, use as a bendable light emitting device or illumination is also anticipated.

[Patent Document 1] Japanese Unexamined Patent Publication No. 2008-21480

However, since a luminescent layer included in the organic EL is an organic substance, there has been a problem in that it has low heat resistance and a short lifetime. In addition, it has a lower luminescent efficiency than that of the nitride-based LED.

DISCLOSURE OF INVENTION

In view of such circumstances, an object of the invention is to provide a semiconductor substrate, a semiconductor device, a light emitting device and an electronic device which have a low price, a long lifetime, and a high luminescent efficiency, and moreover are capable of being bent.

To achieve the above object, the semiconductor substrate according to the invention includes a graphite substrate having heat resistance and having flexibility with respect to external force, and a first semiconductor layer, provided on the graphite substrate, which is made of a nitride of the Group XIII.

According to the invention, a graphite substrate having heat resistance and having flexibility with respect to external force, and a first semiconductor layer, provided on the graphite substrate, which is made of a nitride of the Group XIII are included, and a method such as pulse sputter deposition can be used in forming the first semiconductor layer on the graphite substrate, to thereby allow inexpensive manufacturing to be possible. In addition, since the nitride of the Group XIII is an inorganic substance, it has a long lifetime, and thus a high luminescent efficiency can be obtained. Moreover, since the graphite substrate has flexibility with respect to external force, it can also be bent. Thereby, it is possible to obtain a semiconductor substrate which has a low price, a long lifetime, and a high luminescent efficiency, and moreover is capable of being bent.

In the above-mentioned semiconductor substrate, the graphite substrate includes a sintered polymer.

According to the invention, since the graphite substrate includes a sintered polymer, it has high heat resistance, and can be easily bent by external force. Since the graphite substrate can also be treated under a high temperature, it can be treated under a high temperature by a pulse sputter deposition method or a metallo organic chemical vapor deposition method, a molecular beam epitaxy method and the like.

In the above-mentioned semiconductor substrate, the thickness of the graphite substrate is equal to or less than 100 μm.

According to the invention, since the thickness of the graphite substrate is equal to or less than 100 μm, the graphite substrate has very excellent flexibility with respect to external force.

The above-mentioned semiconductor substrate further includes a second semiconductor layer, provided between the graphite substrate and the first semiconductor layer, which includes at least one of HfN (hafnium nitride) and ZrN (zirconium nitride).

It is known that HfN and ZrN have high optical reflectivity. According to the invention, since the semiconductor substrate further includes a second semiconductor layer including at least one of HfN and ZrN between the graphite substrate and the first semiconductor layer, it is possible to reflect light through the second semiconductor layer. Thereby, when the first semiconductor layer is used as a luminescent layer, it is possible to raise a use efficiency of light from the luminescent layer.

The above-mentioned semiconductor substrate further includes a third semiconductor layer, provided between the graphite substrate and the first semiconductor layer, which includes AlN (aluminum nitride).

According to the invention, since the semiconductor substrate further includes a third semiconductor layer including AlN between the graphite substrate and the first semiconductor layer, it is possible to increase the grain size of the first semiconductor layer. Thereby, it is possible to raise the electrical characteristics of the first semiconductor layer, and to also raise the optical characteristics of the first semiconductor layer especially when the first semiconductor layer is used as a luminescent layer.

The semiconductor device according to the invention includes the above-mentioned semiconductor substrate.

According to the invention, it is possible to obtain a semiconductor device, available for a field wider than that of the prior art, including the semiconductor substrate which has a low price, a long lifetime, and a high luminescent efficiency, and moreover is capable of being bent.

The light emitting device according to the invention includes the above-mentioned semiconductor device.

According to the invention, it is possible to obtain a long-lifetime device at a low price which is flexible and is capable of performing surface emission.

The electronic device according to the invention includes the above-mentioned semiconductor device.

According to the invention, it is possible to obtain a device at a low price which has flexibility and high electrical characteristics.

According to the invention, it is possible to obtain a semiconductor substrate, a semiconductor device, a light emitting device and an electronic device which have a low price, a long lifetime, and a high luminescent efficiency, and moreover are capable of being bent.

REFERENCE NUMBERS IN FIGURES

1: SEMICONDUCTOR SUBSTRATE
2: HEAT DISSIPATION SHEET
3: BUFFER LAYER
4: SEMICONDUCTOR THIN FILM
10: SPUTTERING SYSTEM
11: CHAMBER
12: SUBSTRATE ELECTRODE
13: TARGET ELECTRODE
13a: TARGET
14: DC POWER SUPPLY
15: CONTROL SECTION
16: NITROGEN SUPPLY SOURCE
17: HEATING UNIT

BEST MODE FOR CARRYING OUT THE INVENTION

An embodiment of the invention will be described with reference to the drawings.

Figure 1:
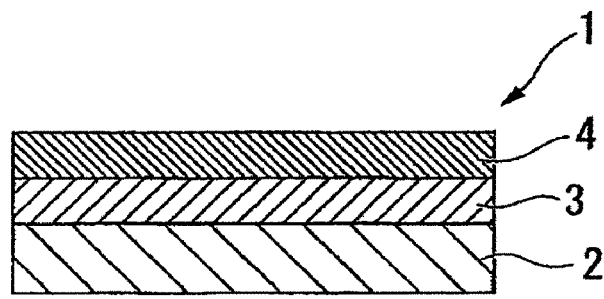
FIG. 1 is a diagram illustrating a configuration of a semiconductor substrate according to an embodiment of the invention.

FIG. 1 is a diagram illustrating a configuration of a semiconductor substrate 1 according to the embodiment.

As shown in the same drawing, the semiconductor substrate 1 is configured such that a buffer layer 3 is provided on a heat dissipation sheet 2, and a semiconductor layer 4 is laminated on the buffer layer 3. This semiconductor substrate 1 is mounted in a light emitting device or an electronic device and the like.

The heat dissipation sheet 2 is made of, for example, a graphite film manufactured by sintering a polymer such as polyoxadiazole at approximately 3000° C. or so. This graphite film has a thermal conductivity of approximately 1700 W/m·K or so in a film in-planar direction, and the value of this thermal conductivity corresponds to a value four times that of Cu. In addition, since the graphite film has a high heat resistance, it can be treated even under a high temperature. Further, it has a high electrical conductivity of $5 \times 10^{-5}$ S/cm or so in a film in-planar direction.

Since this graphite film is 25 μm to 100 μm or so in thickness, it has flexibility with respect to external force. For this reason, it is configured to be capable of being bent. The graphite sheet 2 can be formed in a large area of 50 cm² or more.

Figure 2:
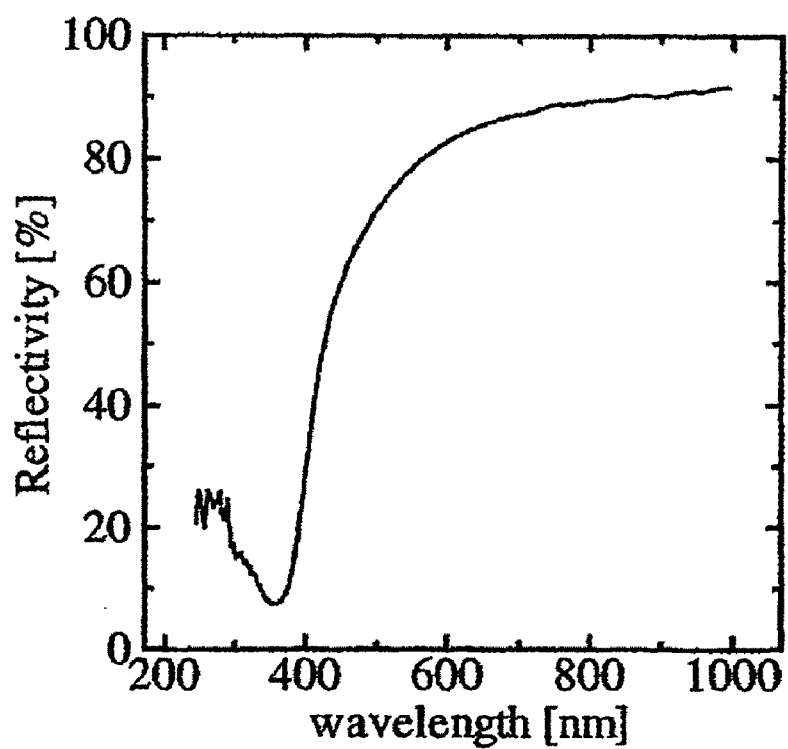
FIG. 2 is a graph illustrating optical reflectivity of ZrN.

The buffer layer 3 is a layer made of, for example, zirconium nitride (ZrN (b 111)), and is interposed between the heat dissipation sheet 2 and the semiconductor layer 4. FIG. 2 is a graph illustrating optical reflectivity of zirconium nitride. The horizontal axis of the graph shows a wavelength, and the vertical axis of the graph shows optical reflectivity.

Figures 3, 4:
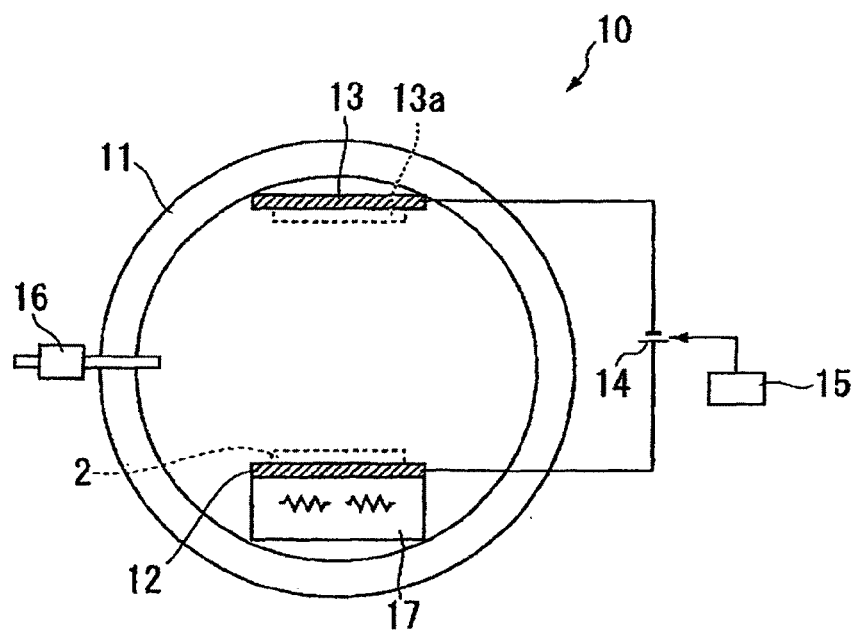
FIG. 3 is a diagram illustrating a correspondence relationship between the optical reflectivity of ZrN and the reflection wavelength.
FIG. 4 is a diagram illustrating a configuration of a sputtering system according to the embodiment.

FIG. 3 is a table illustrating a correspondence relationship between the optical reflectivity of zirconium nitride and the wavelength of the corresponding light.

As shown in FIGS. 2 and 3, the optical reflectivity at 470 nm, which is a wavelength range of blue light, is 65.6% in zirconium nitride. Based on this, it can be said that light of nearly 65% or more can be reflected when blue light is applied thereto in the buffer layer 3 made of zirconium nitride.

The semiconductor layer 4 is a semiconductor layer made of, for example, a nitride semiconductor of the Group XIII. The nitrides of the Group XIII include, for example, GaN (gallium nitride), AlN (aluminum nitride), InN (indium nitride) and the like, and are represented by the general expression of $In_XGa_YAl_{1-X-Y}N$ ($0 \leq X \leq 1$, $0 \leq Y \leq 1$, $0 \leq X+Y \leq 1$).

FIG. 4 is a diagram illustrating a configuration of a sputtering system which is a manufacturing system of the semiconductor layer 4 and the buffer layer 3 mentioned above.

As shown in the same drawing, the sputtering system 10 is constituted using a chamber 11, a substrate electrode 12, a target electrode 13, a DC power supply 14, a power supply control section 15, a nitrogen supply source 16, and a heating unit 17 as chief components.

The chamber 11 is provided so as to be capable of being sealed against the outside. The chamber 11 is configured such that the inside thereof can be decompressed by a vacuum pump and the like which is not shown.

The substrate electrode 12 is disposed within the chamber 11, and is configured to be capable of holding the above-mentioned heat dissipation sheet 2.

The target electrode 13 is provided opposite to the substrate electrode 12 within the chamber 11, and is configured to be capable of holding a target 13a. The target 13a is made of, for example, Zr (zirconium) or an alloy thereof.

The DC power supply 14 is electrically connected to the substrate electrode 12 and the target electrode 13, respectively, and is a voltage source that applies a DC voltage between the substrate electrode 12 and the target electrode 13.

The control section 15 is connected to the DC power supply 14, and performs control relating to an operation timing of the DC power supply 14. A pulse voltage can be applied between the substrate electrode 12 and the target electrode 13 by the control section 15.

The nitrogen supply source 16 is connected to the inside of the chamber 11 through, for example, a supply tube and the like, and supplies nitrogen gas into the chamber 11. Although not shown, an argon gas supply source that supplies argon gas into the chamber is also provided in addition to the nitrogen supply source 16.

The heating unit 17 is fixed to, for example, the substrate electrode 12, and is configured to be capable of adjusting the ambient temperature of the heat dissipation sheet 2 on the substrate electrode 12.

Next, a process for manufacturing the semiconductor substrate 1 according to the embodiment will be described using the above-mentioned sputtering system 10. In the embodiment, a PSD method (pulse sputter deposition method) of applying a pulse DC voltage between the substrate and the target will be described by way of example. Particularly in the embodiment, since a semiconductor thin film is formed on the heat dissipation sheet 2 capable of being formed in a large area, it is significant that the PSD method is performed.

First, the argon gas is supplied into the chamber 11, and then the nitrogen gas is supplied from the nitrogen supply source 16 into the chamber 11. After the inside of the chamber 11 reaches a predetermined pressure due to the argon gas and the nitrogen gas, the heat dissipation sheet 2 is held at the substrate electrode 12, and the target 13a is installed on the target electrode 13.

After the heat dissipation sheet 2 and the target 13a are disposed, the ambient temperature of the heat dissipation sheet 2 is adjusted by the heating unit 17. When the ambient temperature of the heat dissipation sheet 2 is adjusted, a DC pulse voltage is applied between the substrate electrode 12 and the target electrode 13.

While the pulse voltage is applied, plasma caused by the argon gas is generated, and is collided with the target 13a. Zr atoms included in the target 13a are discharged into the chamber 11 by receiving the collision energy. The Zr atoms having this high energy are supplied onto the heat dissipation sheet 2. On the surface of the heat dissipation sheet 2, nitrogen within the chamber changes to nitrogen radicals.

The Zr atoms having high energy are supplied onto the heat dissipation sheet 2 in large quantities, and the surface of the heat dissipation sheet 2 is in a metal-rich state. In the metal-rich state, the Zr atoms on the heat dissipation sheet 2 migrate to a stable lattice location. The Zr atoms migrating to the stable lattice location react with the nitrogen radicals activated within the chamber 11 to form a crystal of metal nitride (ZrN). Whenever the pulse voltage is applied between the substrate electrode 12 and the target electrode 13, ZrN having a stable crystalline structure is deposited.

Next, the semiconductor layer 4 is formed on the formed buffer layer 3 by the same method. In this way, the semiconductor substrate 1 shown in FIG. 1 is completed.

According to the embodiment, since methods such as the pulse sputter deposition method can be used in forming the semiconductor layer 4 on the heat dissipation sheet 2 made of a graphite film capable of being treated under high temperature, inexpensive manufacture is possible. In addition, since the nitride of the Group XIII is an inorganic substance, it has a long lifetime, and can obtain a high luminescent efficiency. Moreover, since the heat dissipation sheet 2 has flexibility with respect to external force, it is also capable of being bent. Thereby, it is possible to obtain a semiconductor substrate which has a low price, a long lifetime, a high luminescent efficiency, and moreover is capable of being bent.

The technical scope of the invention is not limited to the above-mentioned embodiment, and appropriate changes may be made without departing from the scope of the invention.

For example, in the above-mentioned embodiment, the heat dissipation sheet 2 is an example of "a graphite substrate having heat resistance and having flexibility with respect to external force" of the invention, and is made of a graphite film manufactured by sintering a polymer such as polyoxadiazole at approximately 3000° C. or so, but it is not limited thereto. For example, assuming that one surface of the substrate is a graphite structure, there may, be used a substrate having heat resistance and having flexibility with respect to external force which is configured by laminating a graphite layer on a substrate other than graphite. In addition, there may be used a graphite substrate which is capable of enduring even at a temperature environment of 600° C. or higher, preferably 1200° C. or higher, more preferably 2000° C. or higher, and is capable of being bent at an angle of 120 degrees or less, preferably 90 degrees or less, more preferably 60 degrees or less when external force is applied to both ends of the substrate. In addition, "the graphite substrate having heat resistance and having flexibility with respect to external force" of the invention is, particularly preferably, a graphite having a structure close to a single crystal manufactured by a method of graphitizing a polymer by thermal decomposition, and a graphite film, used as a thermally-conductive sheet, having the features such as high thermal conductivity and flexibility with respect to external force.

Further, in the above-mentioned embodiment, although the buffer layer 3 and the semiconductor layer 4 are formed by the pulse sputtering method, they are not limited thereto, and may be formed by, for example, other thin film forming methods such as PXD (Pulsed Excitation Deposition) including PLD (Pulsed Laser Deposition) or PED (Pulsed Electron Beam Deposition), metallo organic growth, and molecular beam epitaxy.

Further, in the above-mentioned embodiment, although the buffer layer 3 made of ZrN (111) is formed on the heat dissipation sheet 2 as an example, the buffer layer 3 made of HfN (111), for example, may be formed without being limited thereto. In addition, the semiconductor layer 4 may be grown directly on the heat dissipation sheet 2 without forming the buffer layer 3, and there may be a configuration in which the semiconductor layer 4 is laminated (for example, GaN layer/AlN layer/graphite and the like).

EXAMPLE 1

Next, Example 1 according to the invention will be described. In the example, XRD measurement and observation by an electron microscope (SEM) were performed on the heat dissipation sheet 2 used in the above-mentioned embodiment.

Figure 5:
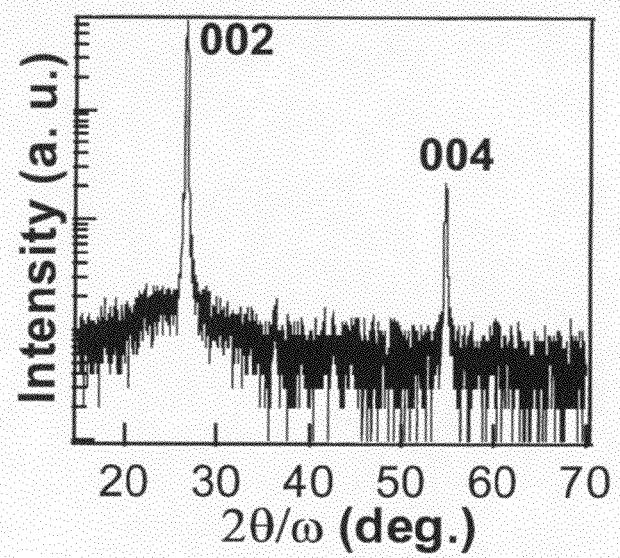
FIG. 5 is an XRD measurement graph of a heat dissipation sheet according to Example 1 of the invention.

FIG. 5 is a graph illustrating a result of the XRD measurement of the heat dissipation sheet 2 described in the above-mentioned embodiment.

As shown in the same drawing, graphite included in the heat dissipation sheet 2 shows strong orientation in (002) and (004), and thus it can be said to be a high-quality single crystal.

Figure 6:
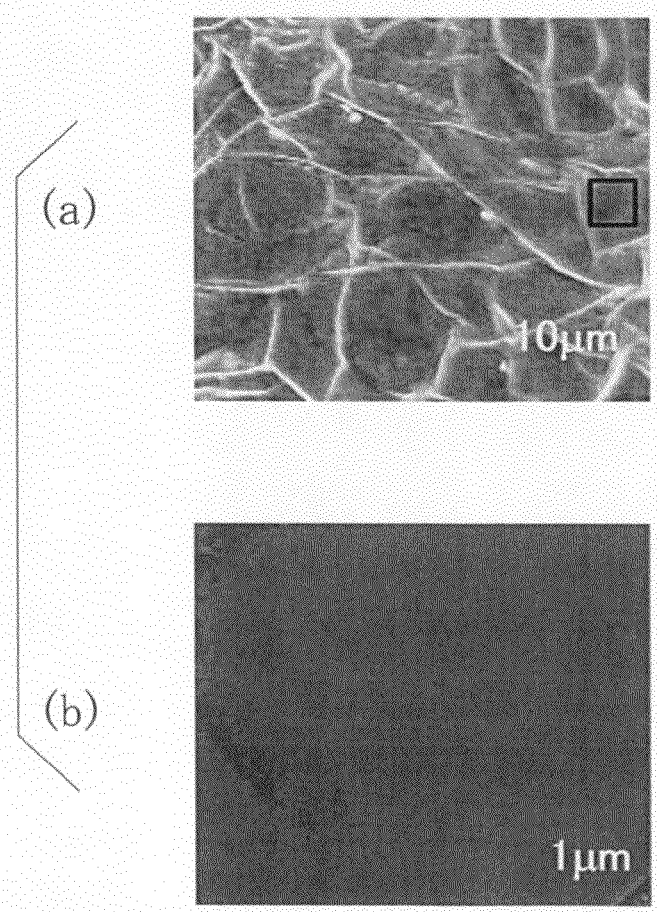
FIG. 6 is SEM images of the surface of the heat dissipation sheet according to Example 1 of the invention.

FIGS. 6(*a*) and 6(*b*) are electron microscope photographs relating to the surface of the heat dissipation sheet 2 described in the above-mentioned embodiment. FIG. 6(*b*) is a photograph obtained by zooming in on one of the grains of FIG. 6(*a*).

As shown in FIG. 6(a), it turns out that the grain size of graphite is 10 µm or more, and the crystallization thereof is high. As shown in FIG. 6(b), it turns out that the unevenness is not visible in the surface, and becomes flat.

From the results of FIGS. 5 and 6, polymer sintered graphite is used as a material of the heat dissipation sheet 2, whereby it can be said to have the excellent characteristics as an underlying substrate for crystal growth of the semiconductor thin film.

EXAMPLE 2

In the example, an AlN layer was formed on the heat dissipation sheet 2 by the method (pulse sputtering method) of the above-mentioned embodiment, and a GaN layer was further formed on the AlN layer. At the time of the AlN growth, the AlN layer was heated at a temperature of 1000° C. to 1200° C. or so, and the heating time was set to 30 min to 60 min or so. At the time of the GaN growth, the GaN layer was heated at a temperature of 650° C. to 750° C. or so, and the heating time was set to 60 min to 120 min or so.

In addition, the semiconductor substrate (GaN/AlN/graphite) manufactured in this way was evaluated by the evaluation methods of reflection high-energy electron diffraction (RHEED), X-ray diffraction (XRD), scanning electron microscope (SEM), electron backscatter diffraction (EBSD), and photoluminescence (PL).

Figure 7:
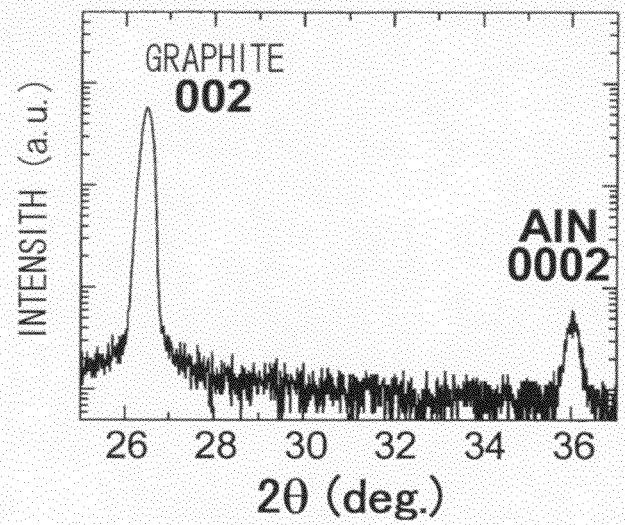
FIG. 7 is an XRD measurement graph of a graphite layer and an AlN layer according to Example 2 of the invention.

FIG. 7 is a graph illustrating a measurement result by XRD of the graphite layer and the AlN layer.

As shown in the same drawing, it is recognized that the graphite layer is grown in the (002) direction, the AlN layer is grown in the (0002) direction, and the AlN layer shows the c-axis orientation.

Figure 8:
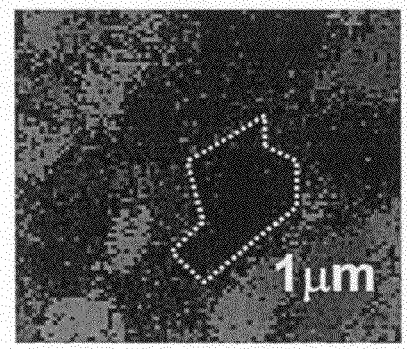
FIG. 8 is an EBSD measurement diagram of the AlN layer according to Example 2 of the invention.

FIG. 8 is an EBSD measurement diagram of the AlN layer.

As shown in the same drawing, it turns out that most crystals having the grain size of 1 µm or more are formed in the AlN layer.

Figure 9:
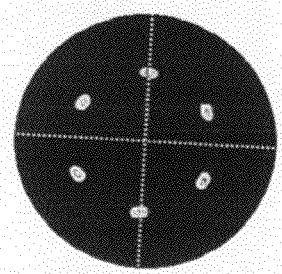
FIG. 9 is an EBSD pole diagram of the AlN layer according to Example 2 of the invention.

FIG. 9 is a {10-12} EBSD pole diagram of a portion of the AlN layer.

As shown in the same drawing, a clear pattern is recognized on the regular hexagonal apex. From this, it turns out that the crystallization of the AlN layer is good.

Figure 10:
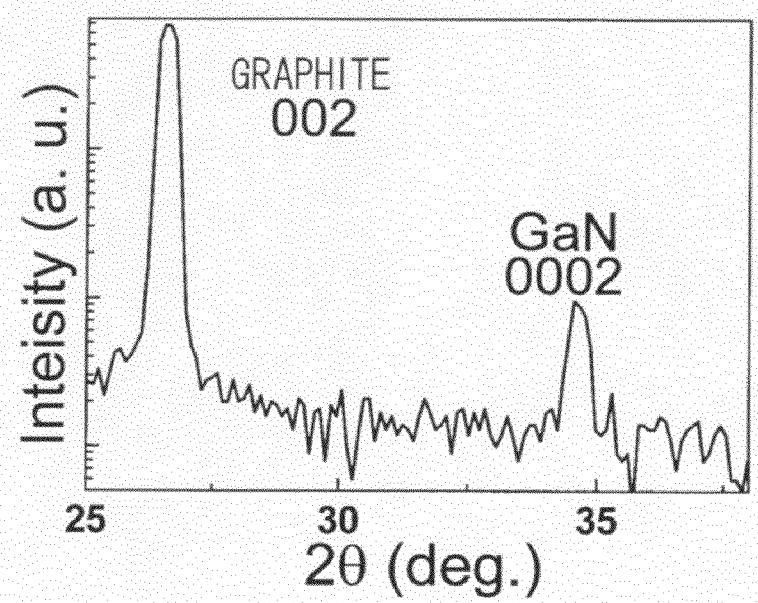
FIG. 10 is an XRD measurement graph of the graphite layer and a GaN layer according to Example 2 of the invention.

FIG. 10 is a graph illustrating a measurement result by XRD of the graphite layer and the GaN layer.

As shown in the same drawing, it is recognized that the GaN layer is grown in the (0002) direction similarly to that of the AlN layer, and shows the c-axis orientation.

Figure 11:
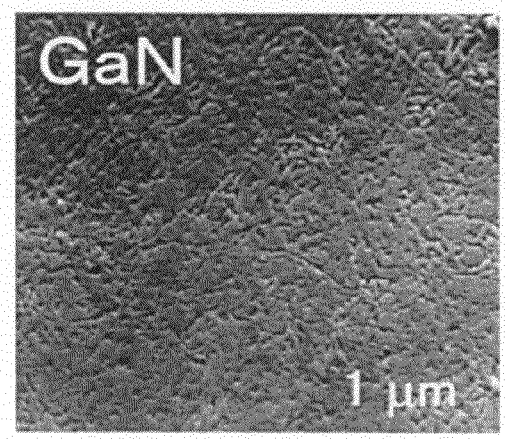
FIG. 11 is an SEM image of the surface of the GaN layer according to Example 2 of the invention.

FIG. 11 is an SEM image of the surface of the GaN layer.

As shown in the same drawing, it turns out that particularly large unevenness is not visible in the surface of the GaN layer, and is formed with a relatively flat surface.

Figure 12:
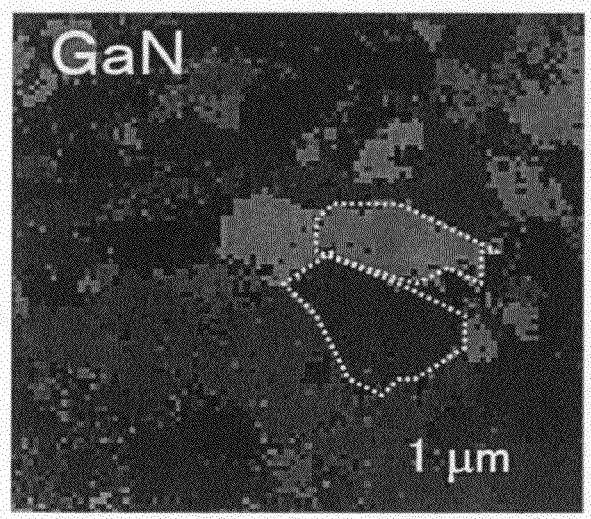
FIG. 12 is an EBSD measurement diagram of the GaN layer according to Example 2 of the invention.

FIG. 12 is an EBSD measurement diagram of the GaN layer.

As shown in the same drawing, it turns out that most crystals having the grain size of 1 µm or more are formed in the GaN layer.

Figure 13:
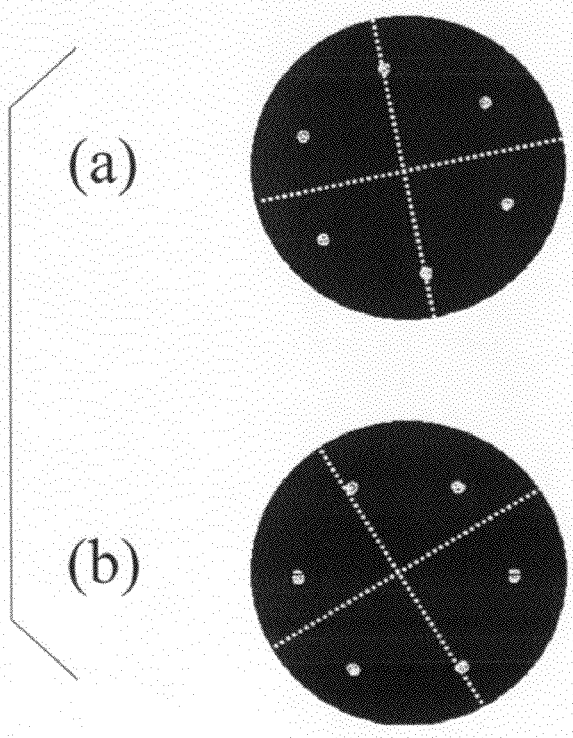
FIG. 13 is EBSD pole diagrams of the GaN layer according to Example 2 of the invention.

FIG. 13 is EBSD pole diagrams of the GaN layer. FIG. 13(a) is a {10-12} EBSD pole diagram of a portion of the GaN layer, and FIG. 13(b) is a {10-12} EBSD pole diagram of another portion of the GaN layer.

As shown in FIGS. 13(a) and 13(b), a clear pattern is recognized on the regular hexagonal apex. From this, it turns out that each of the grains has high crystallization.

Figure 14:
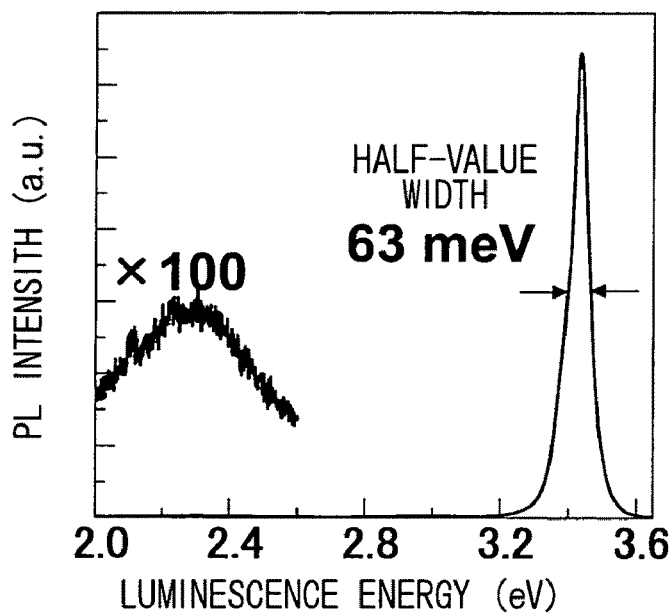
FIG. 14 is a graph illustrating a result of a PL measurement of the GaN layer at room temperature according to Example 2 of the invention.
Figure 15:
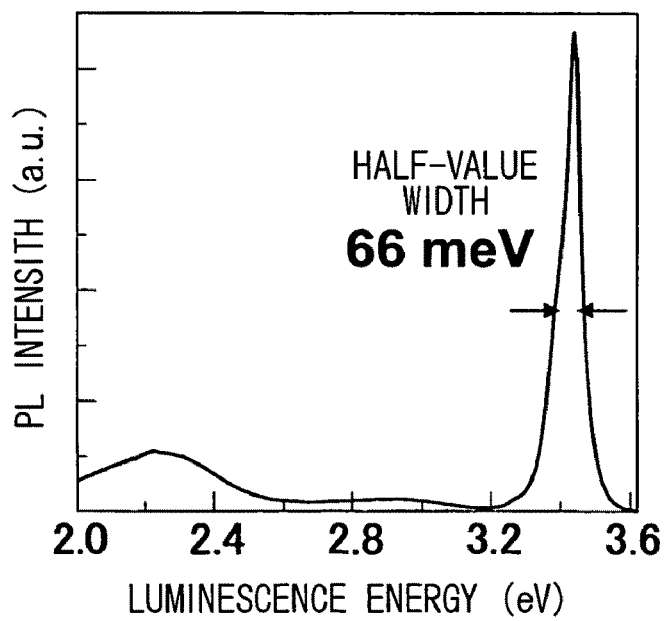
FIG. 15 is a graph illustrating a result of a PL measurement of the GaN layer at room temperature of the prior art.

FIG. 14 is a graph illustrating a result of the PL measurement at room temperature of the GaN layer. FIG. 15 is a graph illustrating a result of the PL measurement at room temperature of the GaN manufactured by MOCVD of the prior art. In both of the drawings, the vertical axis of the graph is PL intensity, and the horizontal axis of the graph is luminescence energy.

As shown in FIG. 14, in the GaN layer obtained by the example, a high peak is recognized in the luminescence energy near 3.4 eV. Measuring the half-value width of this peak gave 63 meV. Further, as shown in FIG. 15, in the GaN substrate of the prior art, a high peak is recognized near 3.4 eV. Measuring the half-value width of this peak gave 66 meV. When the results of FIGS. 14 and 15 are compared with each other, it turns out that the luminescence characteristics of the GaN layer obtained in the example are the same or more than the luminescence characteristics of the GaN substrate of the prior art.

EXAMPLE 3

In the example, an HfN layer was formed on the heat dissipation sheet 2 by the method (pulse sputtering method) of the above-mentioned embodiment, and the GaN layer was further formed on the HfN layer. At the time of the HfN growth, the HfN layer was heated at a temperature of 1000° C. to 1200° C. or so, and the heating time was set to 30 min to 60 min or so. At time of the GaN growth, the GaN layer was heated at a temperature of 650° C. to 750° C. or so, and the heating time was set to 60 min to 120 min.

In addition, the semiconductor substrate (GaN/HfN/graphite) manufactured in this way was evaluated by evaluation methods of X-ray diffraction (XRD), scanning electron microscope (SEM), and electron backscatter diffraction (EBSD).

Figure 16:
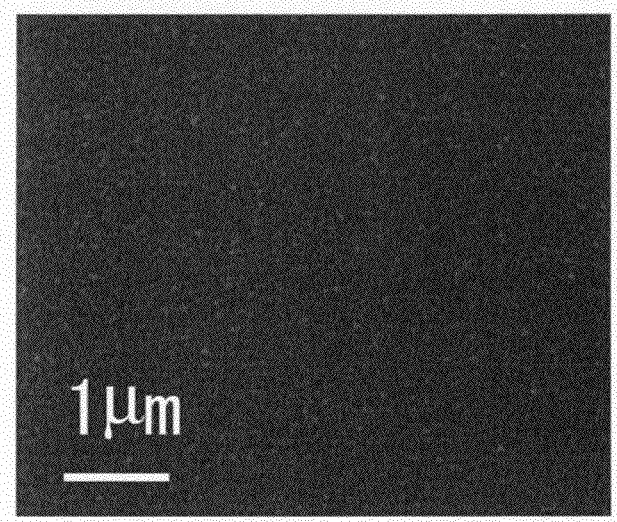
FIG. 16 is an SEM image of the surface of an HfN layer according to Example 3 of the invention.

FIG. 16 is an SEM image of the surface of the HfN layer.

As shown in the same drawing, it turns out that particularly large unevenness is not visible in the surface of the HfN layer, and is formed with a relatively flat surface.

Figure 17:
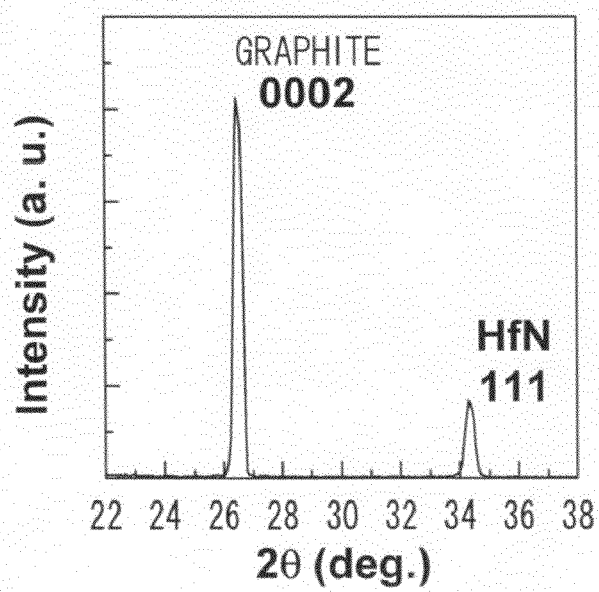
FIG. 17 is an XRD measurement graph of the graphite layer and the HfN layer according to Example 3 of the invention.

FIG. 17 is a graph illustrating a measurement result by XRD of the graphite layer and the HfN layer.

As shown in the same drawing, it is recognized that the graphite layer is grown in the (002) direction, and the HfN layer is grown in the (111) direction. From these results, it turns out that the crystallization of the HfN layer is good and the growth of the HfN thin film having high (111) orientation on the graphite sheet is possible.

Figure 18:
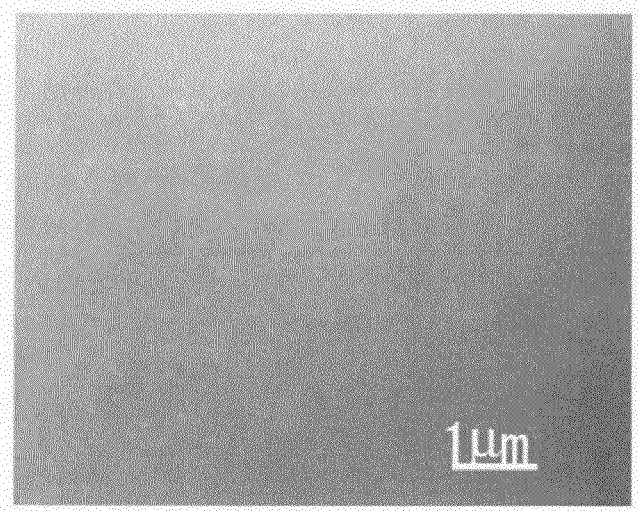
FIG. 18 is an SEM image of the surface of the GaN layer according to Example 3 of the invention.

FIG. 18 is an SEM image of the surface of the GaN layer.

As shown in the same drawing, it turns out that particularly large unevenness is not visible in the surface of the GaN layer, and is formed with a relatively flat surface.

Figure 19:
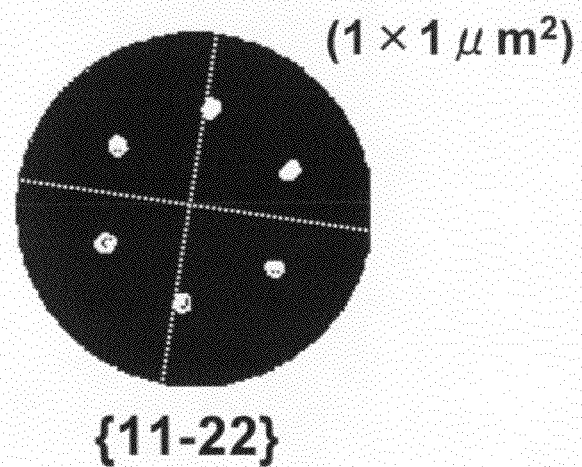
FIG. 19 is an EBSD pole diagram of the GaN layer according to Example 3 of the invention.

FIG. 19 is a {10-12} EBSD pole diagram of another portion of the GaN layer.

As shown in FIG. 19, a clear pattern is recognized on the regular hexagonal apex. From this, it turns out that each of the grains has high crystallization.

It turns out that the growth of the good GaN thin film on the graphite sheet is possible by using the HfN buffer layer.

The invention claimed is:

1. A semiconductor substrate comprising:
   a graphite substrate having heat resistance and having flexibility with respect to external force; and
   a first semiconductor layer, provided on the graphite substrate, wherein the first semiconductor layer is made of a nitride of the family XIII.

2. The semiconductor substrate according to claim 1, wherein the graphite substrate comprises a sintered polymer.

3. The semiconductor substrate according to claim 1, wherein the thickness of the graphite substrate is 100 µm or less.

4. The semiconductor substrate according to claim 1, further comprising a second semiconductor layer, provided between the graphite substrate and the first semiconductor layer, wherein the second semiconductor layer comprises at least one of HfN and ZrN.

5. The semiconductor substrate according to claim 1, further comprising a third semiconductor layer, provided between the graphite substrate and the first semiconductor layer, wherein the third semiconductor layer comprises AlN.

6. A semiconductor device comprising the semiconductor substrate according to claim 1.

7. A light emitting device comprising the semiconductor device according to claim 6.

8. An electronic device comprising the semiconductor device according to claim 6.

* * * * *